United States Patent [19]
Giordano

[11] Patent Number: 4,654,545
[45] Date of Patent: Mar. 31, 1987

[54] OVERVOLTAGE COMPARATOR

[75] Inventor: Raymond L. Giordano, Flemington, N.J.

[73] Assignee: RCA Corporation, Princeton, N.J.

[21] Appl. No.: 834,386

[22] Filed: Feb. 28, 1986

[51] Int. Cl.$^4$ .......................................... H03K 5/153
[52] U.S. Cl. .................................. 307/350; 307/253; 307/358; 307/362
[58] Field of Search ............... 307/10 R, 59, 130, 131, 307/350, 362, 592, 608, 358, 363, 253; 340/660, 661, 662

[56] References Cited

U.S. PATENT DOCUMENTS

| | | | |
|---|---|---|---|
| 4,359,652 | 11/1982 | Jarret et al. | 307/350 |
| 4,418,290 | 11/1983 | Nagano | 307/362 |
| 4,463,271 | 7/1984 | Gill, Jr. | 307/350 |

*Primary Examiner*—John Zazworsky
*Attorney, Agent, or Firm*—Joseph S. Tripoli; Henry I. Schanzer

[57] ABSTRACT

A comparator for comparing a first current proportional to an input voltage against a relatively constant reference current produced by a bandgap reference circuit. The comparator includes hysteresis whereby the response of the comparator is sharpened at the switching points. The comparator is particularly useful in combination with a switch coupling an input voltage source to a load. When the input voltage exceeds a predetermined level the first current exceeds the reference current. The comparator responds sharply and produces a signal disabling the switch and maintaining it shut off until the input voltage decreases below the predetermined level.

4 Claims, 2 Drawing Figures

OVERVOLTAGE COMPARATOR

This invention relates to voltage comparator circuitry and, in particular, to a voltage comparator for sensing when an input voltage ($V_{IN}$) exceeds a predetermined level.

In many applications, it is desirable and/or necessary to use a switch to selectively couple an input voltage ($V_{IN}$) to a load. However, where the input voltage is produced, for example, by a car battery which is subject to large transients, the large transients may damage the load. Of particular interest in this application is the effect of large positive transients and the need to decouple the input voltage from the load when the input voltage exceeds a predetermined value.

Accordingly, circuits embodying the invention include comparator means for sensing when the input voltage exceeds a given value. Another aspect of the invention is directed to means responsive to signals produced by the comparator means for decoupling the input voltage from the load when the input voltage exceeds the given value.

Figure 1:
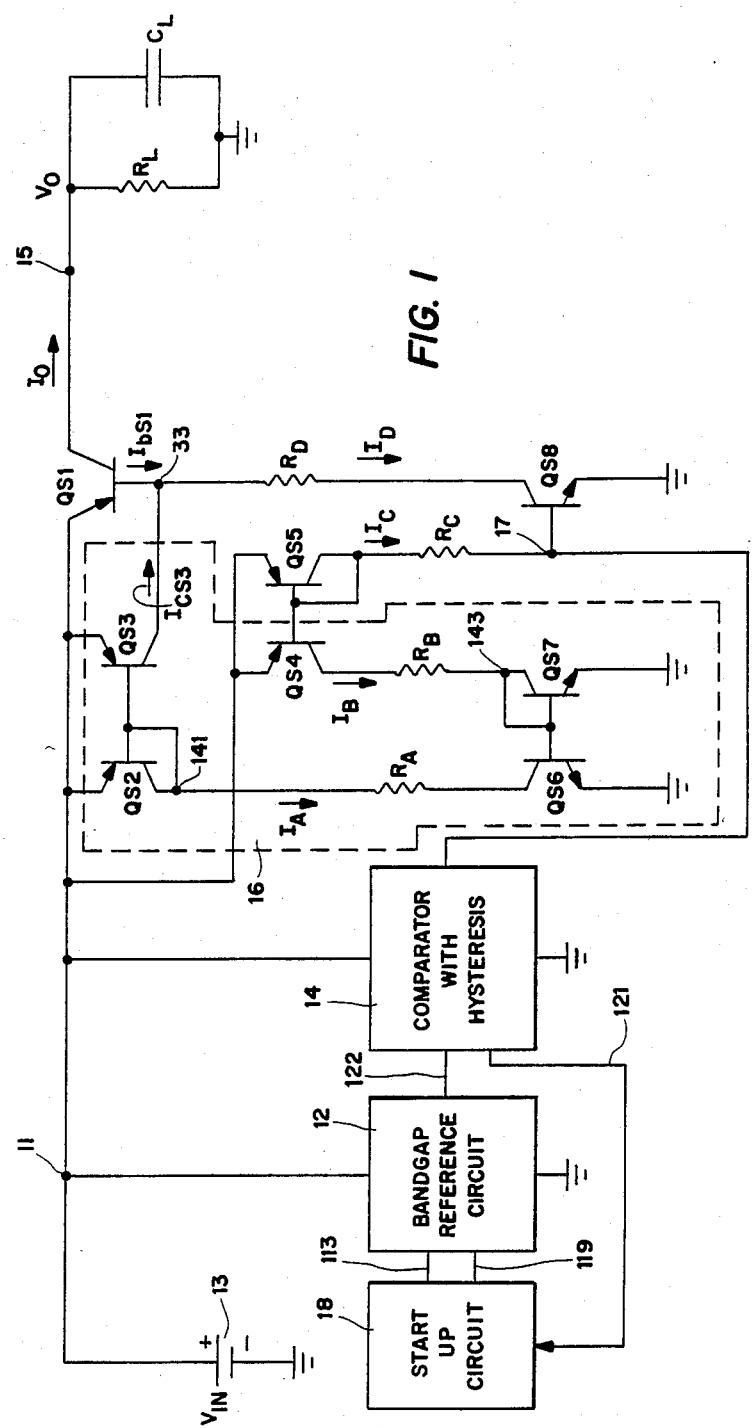
Figure 2:
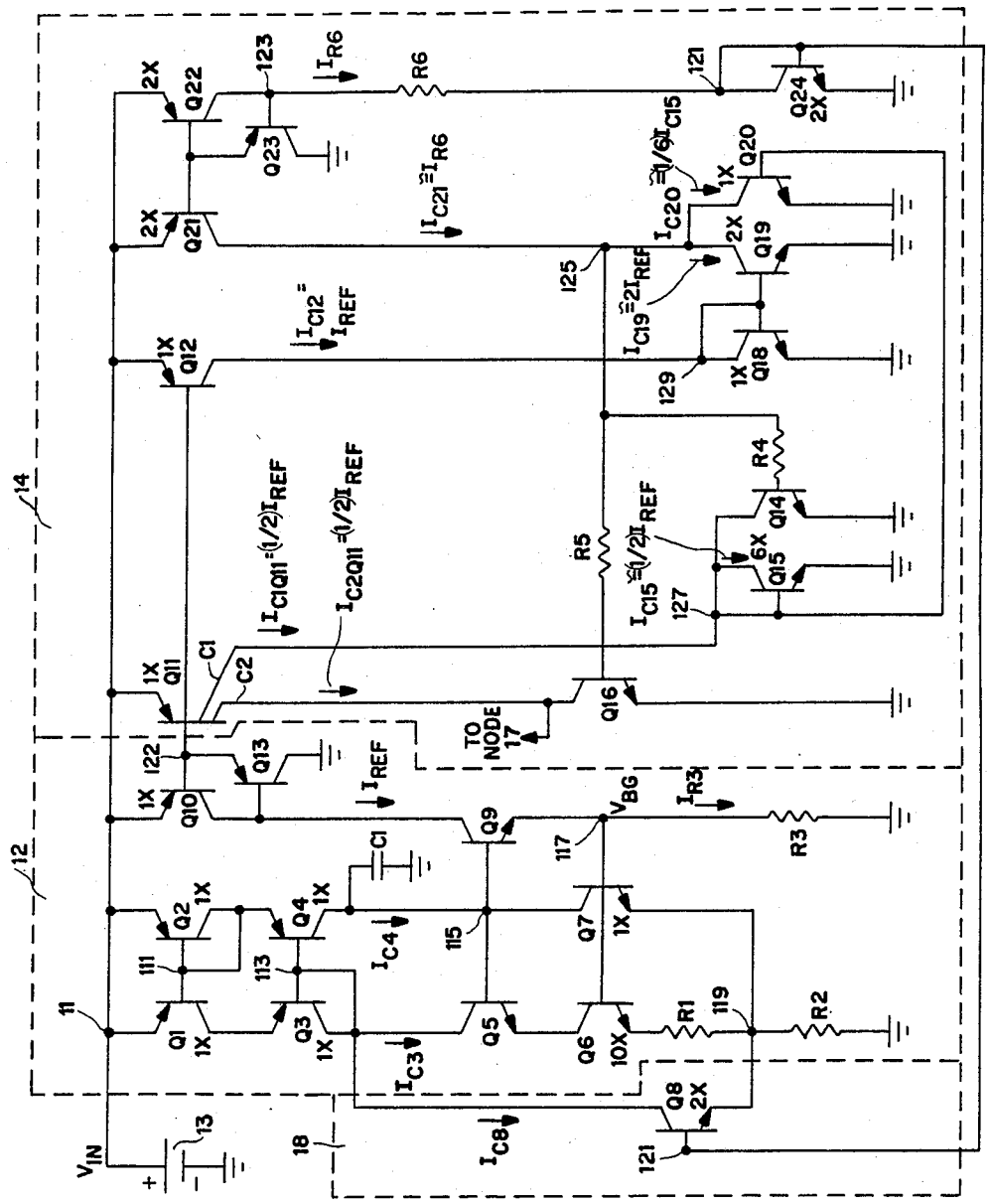

In the accompanying drawing like reference characters denote like components; and FIG. 1 is a semi-block, semi-schematic, diagram of an overvoltage sensing and control system embodying the invention; and FIG. 2 is a schematic diagram of a comparator embodying the invention.

The system shown in FIG. 1 includes a power source 13, which may be, for example, a car battery, connected to an input terminal 11. The voltage produced by source 13 functions as the input voltage to the system and is denoted herein as $V_{IN}$. $V_{IN}$ is coupled to a load, $R_L$, by means of a normally turned-on PNP bipolar transistor QS1 whose emitter is connected to terminal 11 and whose collector is connected to terminal 15.

The load connected between terminal 15 and ground is represented by a resistor $R_L$ across which is connected a filtering and energy storage capacitor $C_L$. Although the load is represented as a resistor $R_L$ and a capacitor $C_L$, it may be, in practice, any number of elements.

QS1 is normally turned-on by means of PNP bipolar transistor QS5 and NPN bipolar transistor QS8. QS5 with its emitter connected to terminal 11 and its base and collector connected to one end of resistor $R_C$ conducts a current $I_C$ via resistor $R_C$ into node 17 to which is connected the base of transistor QS8. Transistor QS8 amplifies its base current and draws a current $I_D$ out of node 33 to which the base of QS1 is connected. The base current drawn out of the base of QS1 is amplified by QS1, resulting in an output current, $I_O$, flowing out of the collector of QS1 into terminal 15 and the load. The current $I_C$ multiplied by the forward current gains of QS8 and QS1 ensures that QS1 is driven into saturation and functions as a switch over a wide range of input voltage conditions. Note that as $V_{IN}$ increases, $I_C$ increases resulting in an increase in $I_D$ and a corresponding increase in $I_O$. Hence, when the QS1 is turned-on there is normally very little voltage drop (e.g. 0.1 to 0.8 volt) across the emitter-to-collector of QS1 and terminal 15 is essentially clamped to terminal 11.

However, as discussed earlier, $V_{IN}$ may be subject to positive transients causing $V_{IN}$ to exceed certain "safe" limits. When the "safe" limit is exceeded the voltage coupled to the output terminal 15 may damage the load.

For purpose of illustration, assume that the "safe" limit is 17.5 volts and that when $V_{IN}$ exceeds 17.5 volts, transistor QS1 is to be turned-off.

The turn-off of QS1 in response to an overvoltage $V_{IN}$ condition is accomplished by means of the combination of a bandgap circuit 12, whose start up is ensured by means of a start-up circuit 18, a comparator circuit 14, and a positive turn-off clamping circuit 16.

The operation of bandgap circuit 12 with start-up circuit 18, and comparator circuit 14 is best explained with reference to FIG. 2. In FIG. 2, the transistors used to illustrate the invention are bipolar transistors and the relative physical sizes of certain transistors, where pertinent, is given by a number preceding the letter "x" (e.g. 1x, 2x). The physical size of a device is proportional to the number preceding the letter "x"; i.e. a 2x device has twice the emitter area as a 1x device and a 2x device conducts twice the current of a 1x device, for like bias conditions. Also, in the discussion to follow, the $V_{BE}$ of a particular transistor Qi is at times denoted as $V_{BEi}$.

In the circuit of FIG. 2, $V_{IN}$ applied to input power terminal 11 may, for example, vary over a very wide range (e.g. from 3 volts to more than 17.5 volts). The bandgap reference circuit 12 is used to produce a relatively fixed bandgap reference voltage ($V_{BG}$) which is used to generate a relatively constant current ($I_{REF}$) proportional to $V_{BG}$. A current proportional to $I_{REF}$ is then compared, by means of comparator 14, to a current whose amplitude varies as a function of the input voltage ($V_{IN}$).

The bandgap reference circuit 12 includes PNP transistors Q1 and Q2 connected at their emitters to input terminal 11 and at their bases to a node 111 to which is also connected the collector of Q2 and the emitter of a PNP transistor Q4. The collector of Q1 is connected to the emitter of a PNP bipolar transistor Q3. The base and collector of Q3 and the base of Q4 are connected to a node 113 to which is also connected the collector of an NPN transistor Q5.

As is known in the art, the transistor string comprising Q1 and Q3 and the transistor string comprising Q2 and Q4 conduct essentially identical currents (where Q1 is the same size as Q2, and Q3 is the same size as Q4) whereby current $I_{c3}$ out of the collector of Q3 is equal to the current $I_{c4}$ out of the collector of Q4; (i.e., $I_{c3}=I_{c4}$).

The collector of an NPN transistor Q5 is connected to node 113 and its emitter is connected to the collector of an NPN transistor Q6. The base of transistor Q5, the collector of a transistor Q7 and the base of a transistor Q9 are connected to a node 115. The bases of Q6 and Q7 and the emitter of Q9 are connected to a node 117 at which is produced the bandgap voltage, $V_{BG}$. A reference current level setting resistor R3 is connected between node 117 and ground.

For reasons detailed below, Q6 is made 10 times the physical size of Q7 resulting in Q6 and Q7 having different current densities and different $V_{BE}$'s. Typically, for the configuration of FIG. 2, by making the size of Q6 ten times the size of Q7 and by forcing equal collector-to-emitter currents through the two transistors the $V_{BE}$ of Q7 minus the $V_{BE}$ of Q6 is approximately equal to 60 millivolts.

A resistor R1 connected between the emitter of Q6 and a node 119, to which is also connected the emitter of Q7, sets the amplitude of $I_{c3}$ and thereby the amplitude of $I_{c4}$. A resistor R2 connected between node 119 and ground, sets the potential at node 119.

When power is first applied to the bandgap circuit, there may be no conduction via Q1, Q2, Q3 and Q4. Start-up circuit 18 is provided to ensure that bandgap circuit 12 is rendered operative on power up and at any time thereafter. Start-up circuit 18 includes an NPN transistor Q8 connected at its collector to node 113, at its emitter to node 119, and at its base to a node 121. When a voltage $V_{IN}$ is first applied to circuits 12 and 14, transistors Q1, Q2, Q3 and Q4 are non-conducting. A portion of a current $I_{R6}$ flowing into node 121 flows into the base of Q8 causing Q8 to draw a starting current $I_{c8}$ out of the bases of Q3 and Q4. The current $I_{c3}$ initially turns on Q1, Q2, Q3 and Q4 causing $I_{c3}$ and $I_{c4}$ to flow. The flow of the collector current $I_{c4}$ in Q4 turns on Q5 and Q9. The turn-on of Q9 causes the turn-on of Q6 and Q7. With Q5 and Q6 turned-on, the current $I_{c3}$ flows via the collector-to-emitter of Q5 and Q6 and resistor R1 into node 119 and the current $I_{c4}$ flows via the collector-to-emitter of Q7 into node 119. The currents $I_{c3}$ and $I_{c4}$ flowing via R2 to ground cause the potential ($V_{119}$) at node 119 to rise to a value of $[I_{c3}+I_{c4}]\cdot[R_2]$. The rise in potential at node 119 tends to turn-off Q8 whose base is held at the base-to-emitter voltage ($V_{BE}$) of Q24.

After the turn-off of Q8 the loop in circuit 12 stabilizes and bandgap circuit 12 remains fully operational producing a bandgap voltage ($V_{BG}$) at node 117 which may be calculated from either of the following two equations:

$$(I_{C3}+I_{C4})(R2)+V_{BE7}=V_{BG} \quad \text{eq. 1}$$

$$(I_{C3}+I_{C4})(R2)+V_{BE6}+(I_{C3})(R1)=V_{BG} \quad \text{eq. 2}$$

In the operation of the bandgap circuit, with Q8 turned-off, a current $I_{C3}$ flows through the collector-to-emitter of Q5 and Q6 and via R1 into node 119. Concurrently, current $I_{C4}$ which is essentially equal to $I_{C3}$ via the collector-to-emitter of Q7 into node 119.

The amplitude of $I_{C3}$ may be determined from the following relationship:

$$V_{BE6}+(I_{C3})\cdot(R1)=V_{BE7} \quad \text{eq. 3}$$

which may be rewritten as:

$$I_{c3}=[V_{BE7}-V_{BE6}]/R1 \quad \text{eq. 4}$$

As discussed earlier, by controlling the size of Q6 relative to Q7 and by forcing equal currents through Q6 and Q7 the difference in their $V_{BE}$ (i.e. $V_{BE7}-V_{BE6}$) becomes a relatively constant value (e.g. 60 millivolts). Then, as per equation 4, the amplitude of $I_{c3}$ may be set by selecting a value of R1. Since $I_{c4}$ must equal $I_{c3}$, setting $I_{c3}$ sets $I_{c4}$. Note that $I_{c3}$ and $I_{c4}$ flow into node 119 and via R2 to ground. The value of R2 may then be specified such that the voltage ($V_{119}$) at node 119, which is equal to $(I_{c3}+I_{c4})\cdot(R2)$, is sufficiently large to cause Q8 to turn-off and remain off as long as $I_{c3}$ and $I_{c4}$ flow.

In a particular circuit, by appropriate choice of R1 and R2, $V_{BG}$ was set at 1.262 volts, a value close to, but slightly greater than, the bandgap voltage of silicon which is approximately 1.205 volts. This choice of $V_{BG}$ was selected to cause $B_{BG}$ to have a positive temperature coefficient over the desired operating range of the system.

$V_{BG}$ is used to set a reference current ($I_{R3}$) which flows through resistor R3 and is equal to $V_{BG}/R3$ and which may be assumed to be relatively constant (e.g. as constant as $V_{BG}$). The Current $I_{R3}$ flowing out of the emitter of Q9 is assumed to be equal to the current $I_{REF}$ in the collector of Q9. The voltage $V_{BG}$ at the emitter of Q9 thus sets the current, $I_{R3}$, which is assumed to be equal to the collector current of Q9, which is identified herein as $I_{REF}$.

The current $I_{REF}$ in the collector of Q9 is identical to the collector current of Q10, which current is then mirrored in the collectors of transistors Q11 and Q12 which form part of comparator 14, as further detailed below.

The collector of Q9 is connected to the collector of PNP transistor Q10 and the base of PNP transistor Q13. The emitter of Q13 is connected to the bases of PNP transistors Q10, Q11 and Q12 at a node 122. The emitters of Q10, Q11 and Q12 are connected to terminal 11, whereby when Q10, Q11 and Q12 have the same physical size, their collector currents are essentially equal.

The collector current of Q10 is equal to the collector current of Q9 which is equal to $I_{REF}$ (neglecting the base current of Q13). Since the emitter and bases of Q11 and Q12 are resepectively connected to the emitter and base of Q10, the current $I_{REF}$ in the collectors of Q9 and Q10 is "mirrored" in the collectors of transistors Q11 and Q12. The collector currents of Q11 and Q12 are proportional to $I_{REF}$ and are used to set and control the switching points of comparator 14. Transistor Q11 has a split collector (C1, C2); one collector (C2) functions as a current source (or load) and is connected to the collector of output transistor Q16, and the other collector (C1) is connected to node 127 and functions as a current source for a hysteresis producing network comprising transistors Q15 and Q20.

In FIG. 2, Q11 and Q12 have the same physical size as Q10. Hence, the total collector current $(I_{c1Q11}+I_{c2Q11})$ of Q11 and the collector current $(I_{c12})$ of Q12 are each essentially equal to $I_{REF}$.

The collector of Q12 is connected to node 129. Hence, when Q12 conducts, $I_{c12}$ flows into node 129 to which is connected the collector and base of NPN transistor Q18 and the base of NPN transistor Q19. The current $I_{c12}$ flowing into node 129 is mirrored in Q19 which is made "M" times the size of Q18. Since $I_{c12}$ is equal to $I_{REF}$, Q19 can sink a current whose amplitude is $MI_{REF}$. Where Q19 is made twice the size of Q18, M is equal to 2 and the current drawn (or sunk) by Q19 is $2I_{REF}$ when the collector current of Q18 is $I_{REF}$. Thus, Q12 produces a current proportional to $I_{REF}$ which is subsequently mirrored into a summing node 125 for comparison with a current proportional to $V_{IN}$.

In addition to the current sunk out of node 125 by Q19, there is an additional current $I_{c20}$, derived from $I_{REF}$, sunk by Q20 and which produces a hysteresis effect. Transistor Q11 has two collectors (its collector is in fact divided, or split, into two halves), C1 and C2, of similar geometry, whereby their respective collector currents, $I_{c1Q11}$ and $I_{c2Q11}$, are equal to each other and each being equal to $\frac{1}{2}I_{REF}$. $I_{c1Q11}$ flows into node 127 to which is connected the collector and base of NPN transistor Q15 and the base of NPN transistor Q20. Q15 and Q20 form a current mirror. Where the physical size of Q20 is made 1/N the size of Q15, the collector current $I_{c20}$ of Q20 is approximately equal to (1/N) the collector current of Q15; (i.e., $I_{c20}$ is equal to $(1/N)\cdot I_{c15}$). Where $I_{c15}$ is equal to $\frac{1}{2}I_{REF}$, $I_{c20}$ is equal to $(1/N)(\frac{1}{2})I_{REF}$. Furthermore, for the case where N is equal to 6, as in FIG. 2, $I_{c20}$ is equal to $1/6 I_{c15}$ and $1/12 I_{REF}$.

The total current sunk out of node 125 is thus the sum of $I_{c19}$ plus $I_{c20}$. For the transistor sizes given in FIG. 2, $I_{c19}$ is equal to $2I_{REF}$ and $I_{c20}$ is equal to $(1/12)I_{REF}$.

So long as the current $I_{c21}$ sourced into node 125 is less than the sum of $I_{c19}$ and $I_{c20}$ the voltage at node 125 is at, or close to, zero volts. For this condition, transistors Q14 and Q16 are turned-off and a current $I_{c2Q11}$ flows from the collector of Q11 into node 17.

It will now be shown that the amplitude of $I_{c21}$ is a function of $V_{IN}$ and that the first switching point of comparator circuit 14 occurs when $I_{c21}$ is equal to the sum of $I_{c19}$ and $I_{c20}$. Comparator 14 includes PNP transistors Q21, Q22 and Q23. The emitters of Q21 and Q22 are connected to terminal 11 and their bases are connected to the emitter of Q23. The base of Q23, whose collector is grounded, is connected to the collector of Q22 at node 123, to reduce the error caused by the base current out of Q21 and Q22. A resistor R6 is connected between nodes 123 and 121. The collector and base of an NPN transistor Q24 are connected to node 121 and its emitter is grounded. A current $I_{R6}$, which flows through R6, may be expressed as follows:

$$I_{R6} = \frac{V_{IN} - V_{BE22} - V_{BE23} - V_{BE24}}{R6} \qquad \text{eq. 5}$$

Assuming $V_{BE22} = V_{BE23} = V_{BE24}$, $I_{R6}$ may be expressed as follows:

$$I_{R6} = \frac{V_{IN} - 3V_{BE}}{R6} \qquad \text{eq. 6}$$

It is evident from equation 6 that $I_{R6}$ is proportional to $V_{IN}$ for values of $V_{IN}$ above $3 V_{BE}$.

The current $I_{R6}$ flowing in the collector of Q22 is mirrored in the collector-to-emitter of Q21. For Q22 having the same physical size as Q21, the collector current ($I_{C21}$) of Q21, which is equal to $I_{R6}$, (which, in turn, is proportional to $V_{IN}$) flows into a summing node 125 to which is connected current sinking transistors Q19 and Q20. As stated above, Q21 sources (or supplies) a current $I_{c21}$ into node 125 which is proportional to $I_{R6}$ which in turn is proportional to $V_{IN}$. Hence $I_{c21}$ into node 125 is equal to $K_1V_{IN}$, where $K_1$ is a constant for values of $V_{IN}$ greater than $3 V_{BE}$ volts. On the other hand, the current drawn (or sunk) out of node 125 is a function of $I_{REF}$, as set forth above.

The currents $I_{c21}$ and $I_{R6}$ increase with increasing $V_{IN}$. Recall that $I_{c21}$ is equal to $I_{R6}$ which is equal to $(V_{IN}-3 V_{BE})/R6$. The first (or positive) switching point of comparator 14 is reached for the value ($V_{INH}$) of $V_{IN}$ which causes the current $I_{c21}$ supplied into summing node 125 to equal the current of $I_{c19}$ and $I_{c20}$ drawn out of node 125. The positive switching point ($V_{INH}$) occurs when $V_{IN}$ goes from a "low" -safe- level and passes above a preset level into a "high" -unsafe- region. In general, as soon as $I_{c21}$ exceeds $MI_{REF}+(\frac{1}{2})(1/N)I_{REF}$, a current flows out of node 125 into the bases of Q14 and Q16, turning them on. The turn-on of Q16 functions to draw current out of the base of QS8 which functions to turn-off QS1 thereby decoupling the load from $V_{IN}$, whose excessive voltage might damage the load.

As soon as Q14 begins to turn-on, it causes the current sourced into node 127 to be diverted from flowing into the collector and base of Q15 and the base of Q20 and to flow instead into the collector-to-emitter of Q14 thus decreasing the collector-to-emitter current in Q20.

The decreased sink current in Q20 causes the current drawn out of node 125 to decrease causing the voltage at node 125 to go more positive (even without an additional increase in $V_{IN}$) and additional current to be supplied out of node 125 into the bases of Q14 and Q16 causing them to be turned-on harder. The process continues due to positive feedback until Q14 is turned-on hard and Q15 and Q20 are turned-off or drawing negligible currents. Thus the combination of Q14, Q15 and Q20 provides hysteresis ensuring the sharp and positive turn-on of Q16 (and Q14) when the positive switching point is reached. In a particular circuit, $I_{c21}$ was designed to equal $I_{c19}$ plus $I_{c20}$ when $V_{IN}$, going from low-to-high, reached 17.5 volts. As soon as $V_{IN}$ exceeds that value, Q20 was turned-off (while Q14 and Q16 were turned-on).

Note that with Q20 turned-off, the second (or negative) switching point of comparator 14 occurs when $V_{IN}$ goes from a "high" -unsafe- level to a "low" -safe- level and $V_{IN}$ has a value, $V_{INL}$, for which $I_{c21}$ is equal to $I_{c19}$ (with Q20 turned-off, there is no $I_{c20}$ flowing). In the design of FIG. 2, so long as $I_{c21}$ is greater than $2I_{REF}$, current flows out of node 125 and into the bases of Q14 and Q16, which, as discussed above, functions to turn-off QS8 and QS1. As soon as $V_{IN}$ decreases such that $I_{c21}$ is less than $2I_{REF}$, the voltage at node 125 decreases, turning-off Q14 and Q16. As soon as Q14 begins to turn-off, the voltage at node 127 rises towards $V_{BE}$ volts causing Q15 and Q20 to conduct. As soon as Q20 is turned-on, it draws a current $[I_{c20}=(1/N)I_{c15}]$ out of node 125 causing the voltage at node 125 to decrease further and faster towards ground. This, of course, causes Q14 and Q16 to be turned-off faster, and Q15 and Q20 to conduct more, until Q15 conducts the full $I_{c1Q11}$ current which is equal to $\frac{1}{2}I_{REF}$ and Q20 conducts a current equal to $(1/N)(\frac{1}{2})I_{REF}$.

Thus, the combination of Q14, Q15 and Q20 provide hysteresis ensuring sharp and positive turn-off of Q16 and Q14 when the negative switching point is reached.

Based on the discussion above, it is evident that:

(1) The positive switching point ($V_{INH}$) occurs when the current $I_{c21}$ "sourced" into node 125 is equal to the currents $I_{c19}+I_{c20}$ "sunk" out of node 125; and (2) The negative switching point ($V_{INL}$) occurs when the current $I_{c21}$ "sourced" into node 125 is equal to the current $I_{c19}$ sunk out of node 125. The values of the positive ($V_{INH}$) and negative ($V_{INL}$) switching points may be determined by analyzing the following relationships.

$$I_{R6} = \frac{V_{IN} - V_{BE22} - V_{BE23} - V_{BE24}}{R6}; \qquad \text{eq. 7}$$

solving for $V_{IN}$ yields:

$$V_{IN} = (I_{R6})(R6) + V_{BE22} + V_{BE23} + V_{BE24}; \qquad \text{eq. 8}$$

Since $I_{R6} = I_{c21}$.

The positive switching point for the turn-on of Q16 occurs when:

$$I_{c21} = I_{R6} = MI_{REF} + REF/2N; \qquad \text{eq. 9}$$

The negative switching point for turn-off of Q16 occurs when:

$$I_{c21} = I_{R6} = MI_{REF}; \qquad \text{eq. 10}$$

Since $I_{REF}$ is equal to $V_{BG}/R3$ and assuming the $V_{BE}$'s to be equal, the values of $V_{INH}$ and $V_{INL}$ may be expressed, in terms of $V_{BG}$, as follows:

$$V_{INH} = M \cdot V_{BG} \frac{R6}{R3} + 3V_{be} + \frac{V_{BG}}{2 \cdot (R3)(N)}; \qquad \text{eq. 11}$$

$$V_{INL} = M \cdot V_{BG} \frac{R6}{R3} + 3V_{bE}; \qquad \text{eq. 12}$$

Where M represents the size ratio of Q12 to Q21 (or that of Q18 to Q19) and N represents the size ratio of Q15 to Q20.

In a particular circuit R3 was made 7,900 ohms, R6 was made 47,500 ohms, N was 6, M was 2, the 3 $V_{BE}$ measured 1.8 volts, $V_{BG}$ was measured to be 1.262 volts, $V_{INH}$ occurred at 17.6 volts and a $V_{INL}$ occurred at 17 volts.

It has thus been shown that the combination of circuits 12, 14, and 18 can sense an overvoltage condition of $V_{IN}$ and due to hysteresis in the comparator, can respond very quickly when the switching point is reached. It has also been shown that the comparator output can be used to turn-off the switching transistors QS1 when the overvoltage condition is present and to allow its turn-on when the overvoltage condition has disappeared.

Returning to FIG. 1, it should be appreciated that when Q16 draws current out of the base of QS8 and turns it off, QS8 draws no current out of the base of QS1 and QS1 is turned-off. However, this mode of turning-off QS1 is slow and the base of QS1 floats. To avoid this problem the system of FIG. 1 includes circuit 16 which ensures that QS1 is positively clamped-off when transistor QS8 is turned-off and no longer draws current out of the base of QS1. Circuit 16 includes PNP transistors QS2 and QS3 having their emitters connected to terminal 11 and their bases connected to a node 141. A resistor $R_A$ is connected between node 141 and the collector of an NPN transistor QS6. The emitters of NPN transistors QS6 and QS7 are grounded, and their bases are connected to a node 143 to which is also connected the collector of QS7. A resistor $R_B$ is connected between node 143 and the collector of a PNP transistor QS4 whose emitter is connected to terminal 11 and whose base is connected to the base of QS5.

For values of $V_{IN}$ typically greater than 2 $V_{BE}$ volts, a current $I_C$ flows out of the collector of QS5 and via resistor $R_C$ into node 17. The current $I_C$ is mirrored via QS4 which can pass a current $I_B$ via resistor $R_B$ into node 143. The current $I_B$ is mirrored via QS6 which can pass a current $I_A$ drawn out of the collector and base of QS2. The current $I_A$ is mirrored via QS3 which produces a current $I_{cs3}$ into node 33. Resistors $R_A$, $R_B$ and $R_C$ ensure that the current $I_{cs3}$ is limited for reasons discussed below.

Under normal operating conditions, QS8 is turned-on and draws a current $I_D$ out of node 33. The current $I_D$ is comprised of the base current, $I_{bs1}$, drawn out of QS1 and the collector current $I_{cs3}$ flowing out of the collector of QS3. Limiting the value of $I_{cs3}$ ensures that when QS8 is turned-on, $I_D$ is comprised primarily of $I_{bs1}$ and QS1 is indeed turned-on hard.

When $V_{IN}$ exceeds a "safe" value, comparator 14 draws current out of node 17, turning-off QS8. In the absence of QS3, the turn-off of QS8 allows the base of QS1 to float and its turn-off to be relatively slow. However, QS3 and circuit 16 ensures that QS1 is positively and quickly turned-off. When QS8 is turned-off, the current $I_D$ goes to zero (leakage currents are neglected). However, currents $I_A$, $I_B$, $I_C$ and $I_{cs3}$ continue to flow. In fact, $I_{cs3}$ flows into node 33 charging the node and causing the positive turn-off of QS1. Furthermore, with QS8 turned-off and its collector-to-emitter path representing a high impedance, QS3 saturates and functions to clamp the emitter and base of QS1 ensuring its unconditional, positive and quick turn-off.

Returning to bandgap circuit 12, recall that $V_{BG}$ was designed to be close to the bandgap voltage of silicon and to have a positive temperature coefficient over the required temperature range of operation. The positive temperature coefficient (tempco) of $V_{BG}$ is required to compensate for the negative temperature coefficients of the "3 $V_{BE}$" term in equation 12, and to reduce changes in switch point voltages over the required temperature range.

Thus, by setting the right hand side of equation 12 to zero:

$$M \frac{R_6}{R_3} [\text{Tempco } V_{BG}] + [\text{Tempco } 3V_{BE}] = 0; \qquad \text{eq. 13}$$

For M=2, $R_6$=47.5 Kohms, $R_3$=7.9 Kohms, and neglecting the error caused by the hysteresis term, equation 13 indicates that $V_{BG}$ has a positive temperature coefficient of 0.5 millivolts/°C. which is needed to compensate for the $-6$ millivolts/°C. of the "3 $V_{BE}$" term.

Returning to FIG. 2, it should also be noted that the appropriate interconnection of the start-up circuit 18 to the bandgap circuit 12 is needed for proper operation. The connection of the base of Q8 to the base and collector of Q24 ensures the initial turn-on of the band gap reference circuit. When power is first applied to the circuit of FIG. 2, Q24 conducts and causes Q8 to turn-on and to draw current out of the bases of Q3 and Q4. Once Q3 and Q4 conduct, currents IC3 and IC4 are supplied into node 119 and via resistors R2 to ground. The drop across resistor R2 raises the potential at node 119 tending to decrease the base-to-emitter voltage of Q8 and to turn-it-off.

Applicant discovered that returning the emitter of Q8 to node 119 rather than to the emitter of Q6 resulted in significantly improved operation. Decoupling the emitter of Q8 from Q6 by means of resistor R1 and connecting the emitter of Q8 to that of Q7 at node 119 provided highly stable and latch free operation.

At voltages $V_{IN}$ greater than the zener breakdown voltage of the base-emitter junction of Q8 plus the forward drop $V_{BE}$ of Q24, Q8 can break down under transient conditions and cause a stable state in the bandgap loop causing $V_{BG}$ to be approximately equal to $V_{ZQ8}$+2 $V_{be}$, if the emitter of Q8 is connected to the emitter of Q6. However by connecting the emitter of Q8 at node 119 which is a common mode point for Q6 and Q7, the latch cannot be maintained and proper operation ensues.

It should be noted that in the comparator circuit 14, Q12 and Q21 had a size ratio of 1 to M (where M is equal to 2) and Q18 and Q19 have a like ratio of 1 to M; the ratio'ing was incorporated in the design to cause Q12 and Q21 to have similar current densities and similar collector-to-emitter voltages at the desired switching points ($V_{INH}$ and $V_{INL}$) in order to minimize and thereby reduce the effect of a mismatch in the output resistances (between emitter and collector) of these devices (Q12 and Q21). The output resistance of a transistor is a function of its collector current and its collector-to-emitter voltage. Therefore, keeping the current densities in Q12 and Q21 similar as well as keeping their collector-to-emitter voltages similar at the switch points minimize mismatches due to the output resistance of the devices and considerably improves the switching point accuracy and repeatability.

In equations 11 and 12, the switching points are shown to be expressible as a ratio of resistor R6 to R3. This is significant when R6 and R3 are made in a similar manner and vary in a similar fashion. This produces a relatively constant ratio of resistor values resulting in the cancellation of variations as a function of temperature and processing.

What is claimed is:

1. The combination comprising:
   first and second power terminals for the application therebetween of an input voltage ($V_{IN}$) which may vary over a relatively wide range;
   a current summing node;
   first means, coupled between said first and second power terminals and said summing node, responsive to said $V_{IN}$ for producing and conducting a first current, proportional to said $V_{IN}$ between said summing node and one of said first and second power terminals;
   a reference circuit connected between said first and second power terminals for producing a relatively fixed voltage independent of the variations of said $V_{IN}$;
   second means coupled between said reference circuit and said summing node responsive to said relatively fixed voltage for producing and conducting a second relatively fixed current between said summing node and the other one of said first and second power terminals;
   a controllable third means connected between said summing node and said other one of said first and second power terminals for conducting a third current therebetween, said third current being a fraction of said second current; and
   fourth means, coupled between said summing node and said third means, responsive to the difference between said first current and the sum of said second and third currents, for disabling said third means and inhibiting the flow of said third current when said first current is greater than the sum of said second and third currents and for subsequently enabling said third means when said first current is less than said second current.

2. The combination as claimed in claim 1 further including:
   (a) an output terminal for the connection thereto of load means;
   (b) selectively enabled switch means, coupled between said first power terminal and said output terminal for, when enabled, coupling said $V_{IN}$ to said output terminal; and
   means coupled to said summing node responsive to said first current being greater than the sum of said second and third currents for disabling said switch means.

3. The combination as claimed in claim 1, wherein each one of said first, second, third and fourth means includes at least one transistor having a base, an emitter and a collector; and
   wherein said first means includes a first transistor having its emitter connected to said one of said first and second power terminals and its collector connected to said summing node;
   wherein said second means includes a second transistor having its collector connected to said summing node and its emitter connected to said other one of said first and second power terminals;
   wherein said third means includes a third transistor having its collector connected to said summing node and its emitter connected to said other one of said first and second power terminals; and
   wherein said fourth means includes a fourth transistor having its base connected to said summing node and its collector-to-emitter path connected between the base and emitter of said third transistor.

4. The combination comprising:
   first and second power terminals for the application therebetween of an input voltage ($V_{IN}$);
   an output terminal for the connection thereto of load means;
   selectively enabled switch means coupled between said first power terminal and said output terminal for, when enabled, coupling said $V_{IN}$ to said output terminal;
   comparator means coupled between said first and second power terminals and said selectively enabled switch means, said comparator means being responsive to the amplitude of $V_{IN}$ for disabling said switch means when said $V_{IN}$ exceeds a predetermined value; said comparator means comprising:
   (a) a current summing node;
   (b) first means, coupled between said first and second power terminals and said summing node, responsive to said $V_{IN}$ for producing and conducting a first current, proportional to said $V_{IN}$, between said summing node and one of said first and second power terminals;
   (c) a reference circuit connected between said first and second power terminals for producing a relatively fixed voltage irrespective of the variations of said $V_{IN}$;
   (d) second means coupled between said first circuit and said summing node responsive to said relatively fixed voltage for producing and conducting a second relatively fixed current between said summing node and the other one of said first and second power terminals;
   (e) a controllable third means connected between said summing node and said other one of said first and second power terminals for conducting a third current therebetween, said third current being a fraction of said second current;
   (f) fourth means, coupled between said summing node and said third means, responsive to the difference between said first and second and third currents, for disabling said third means and inhibiting the flow of said third current when said first current is greater than the sum of said second and third currents and for subsequently enabling said third means when said first current is less than said second current; and
   (g) means coupled between said summing node and said selectively enabled switch means for controlling its turn-on and turn-off.

* * * * *

UNITED STATES PATENT AND TRADEMARK OFFICE
CERTIFICATE OF CORRECTION

PATENT NO. : 4,654,545

DATED : Mar. 31, 1987

INVENTOR(S) : Raymond L. Giordano

It is certified that error appears in the above-identified patent and that said Letters Patent is hereby corrected as shown below:

Col. 1, line 61, after "when" delete --- the ---.

Col. 3, line 37, after "$I_{C3}$" insert --- flows ---.

Col. 3, line 63, change "$B_{BG}$" to --- $V_{BG}$ ---.

Col. 4, lines 36-37, change "$(I_{c1Q1-1}+I_{c2Q11})$" to --- $(I_{c1Q11}+I_{c2Q11})$ ---.

Col. 6, line 62, change "$I_{c21}=I_{R6}=MI_{REF}+REF/2N$" to --- $I_{c21}=I_{R6}=MI_{REF}+I_{REF}/2N$ ---.

Signed and Sealed this

Fifteenth Day of December, 1987

*Attest:*

DONALD J. QUIGG

*Attesting Officer*   *Commissioner of Patents and Trademarks*